(12) United States Patent
Moens et al.

(10) Patent No.: US 10,797,168 B1
(45) Date of Patent: Oct. 6, 2020

(54) ELECTRONIC DEVICE INCLUDING A HIGH ELECTRON MOBILITY TRANSISTOR THAT INCLUDES A BARRIER LAYER HAVING DIFFERENT PORTIONS

(71) Applicant: Semiconductor Components Industries, LLC, Phoenix, AZ (US)

(72) Inventors: Peter Moens, Erwetegem (BE); Arno Stockman, Ronse (BE); Samir Mouhoubi, Oudenaarde (BE); Abhishek Banerjee, Kruibeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/665,730

(22) Filed: Oct. 28, 2019

(51) Int. Cl.
| | |
|---|---|
| *H01L 29/778* | (2006.01) |
| *H01L 29/205* | (2006.01) |
| *H01L 29/66* | (2006.01) |
| *H03K 17/10* | (2006.01) |
| *H01L 29/20* | (2006.01) |
| *H01L 21/265* | (2006.01) |

(52) U.S. Cl.
CPC ...... *H01L 29/7787* (2013.01); *H01L 29/2003* (2013.01); *H01L 29/205* (2013.01); *H01L 29/66462* (2013.01); *H03K 17/102* (2013.01); *H01L 21/26546* (2013.01)

(58) Field of Classification Search
None
See application file for complete search history.

(56) References Cited

U.S. PATENT DOCUMENTS

| | | | |
|---|---|---|---|
| 6,677,619 B1 | 1/2004 | Nagahama et al. | |
| 9,608,085 B2 * | 3/2017 | Hallin | H01L 29/66462 |
| 10,411,125 B2 * | 9/2019 | Teo | H01L 29/7786 |
| 2011/0086498 A1 | 4/2011 | Cheng et al. | |
| 2013/0126889 A1 | 5/2013 | Bahl | |
| 2014/0034962 A1 | 2/2014 | Curatola et al. | |

OTHER PUBLICATIONS

Park et al.; "NbO2 Based Threshold Switch Device with High Operating Temperature (>85C) for Steep-Slope MOSFET (~2mV/dec) with Ultra-Low Voltage Operation and Improved Delay Time"; IEDM 2017; IEEE; pp. IEDM17-IEDM581 to IEDM17-IEDM584.

(Continued)

*Primary Examiner* — Jeffrey S Zweizig
(74) *Attorney, Agent, or Firm* — Abel Schillinger, LLP

(57) ABSTRACT

An electronic device can include a HEMT that includes a channel layer, a barrier layer, and a gate electrode. The barrier layer can be disposed between the channel layer and the gate electrode and include a first portion, a second portion, and a third portion. The second portion can be spaced apart from the channel layer by the first portion, and the second portion is spaced apart from the gate electrode by the third portion. The second portion of the barrier layer can be configured to trap more charge, more readily recombine electrons and holes, or both as compared to each of the first and third portions of the barrier layer. The HEMT can have a $V_{TH}$ of at least 2 V and a subthreshold slope of at most 50 mV/decade of $I_{DS}$.

20 Claims, 11 Drawing Sheets

(56) References Cited

OTHER PUBLICATIONS

Casu et al.; "Hybrid Phase-Change—Tunnel FET (PC-TFET) Switch with Subthreshold Swing < 10mV/decade and Sub-0.1 Body Factor: Digital and Analog Benchmarking"; IEDM 2016; IEEE; pp. IEDM16-IEDM508 to IEDM16-IEDM511.

Young et al.; "Tunneling Field Effect Transistors: Device and Circuit Considerations for Energy Efficient Logic Opportunities"; IEDM 2015; IEEE; pp. IEDM15-IEDM600 to IEDM15-IEDM603.

Lee et al.; "Prospects for Ferroelectric HfZrOx FETs with Experimentally CET=0.98nm, SSfor=42mV/dec, SSrev=28mV/dec, Switch-OFF < 0.2V, and Hysteresis-Free Strategies"; IEDM 2015; IEEE; pp. IEDM15-IEDM616 to EDM15-IEDM619.

Kuo et al.; Nitride-Based Blue Light-Emitting Diodes Grown with InN/GaN Matrix Quantum Wells; IEEE Journal of Quantum Electronics; vol. 50, No. 4; pp. 255-260 (2014).

Tomioka et al.; "Integration of III-V Nanowires on Si: From High-Performance Vertical FET to Steep-Slope Switch"; IEDM 2013; IEEE; pp. IEDM13-IEDM88 to IEDM13-IEDM91.

\* cited by examiner

US 10,797,168 B1

ELECTRONIC DEVICE INCLUDING A HIGH ELECTRON MOBILITY TRANSISTOR THAT INCLUDES A BARRIER LAYER HAVING DIFFERENT PORTIONS

FIELD OF THE DISCLOSURE

The present disclosure relates to electronic devices, and more particularly to, electronic devices including high electron mobility transistors including barrier layers having different portions.

RELATED ART

A high electron mobility transistor can be enhancement-mode transistor; however, the threshold voltage may be approximately 1.5 V, which may be considered marginal. Regarding a connection to a gate electrode, an ohmic contact can result in relatively high gate leakage current. A Schottky contact can be used for the gate electrode. A gate electrode with a Schottky contact results in poor control on the voltage of the gate electrode. A subthreshold slope can be 80 mV/decade of drain current. A lower value for gate voltage/drain current corresponds to a steeper subthreshold slope. Further improvements in threshold voltage and subthreshold slope for enhancement-mode high electron mobility transistors are desired.

BRIEF DESCRIPTION OF THE DRAWINGS

Embodiments are illustrated by way of example and are not limited in the accompanying figures.

Figure 1:
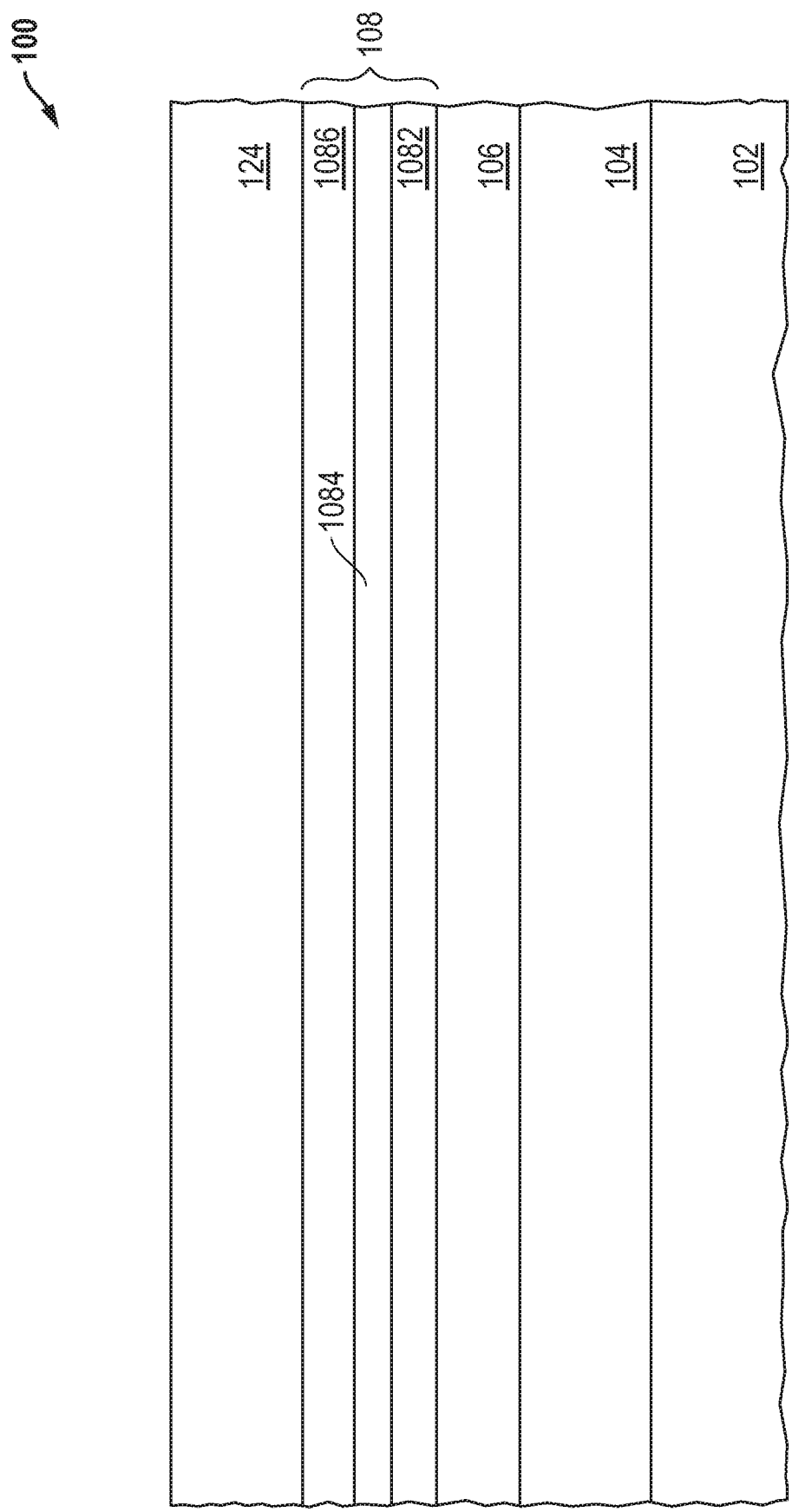
FIG. 1 includes an illustration of a cross-sectional view of a portion of a workpiece including a substrate, a strain-relief layer, a channel layer, a barrier layer, and a gate electrode layer in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "high voltage," with reference to a layer, a structure, or a device, means that such layer, structure, or device can withstand at least 20 V difference across such layer, structure, or device (e.g., between a source and a drain of a transistor when in an off-state) without exhibiting dielectric breakdown, avalanche breakdown, or the like.

The term "semiconductor base material" refers to the principal material within a semiconductor substrate, region, or layer, and does not refer to any dopant within the semiconductor substrate, region, or layer. A boron-doped Si layer has Si as the semiconductor base material, and a C-doped GaN layer has GaN as the semiconductor base material.

The term "voltage rating," with reference to an electronic device, means a nominal voltage that the electronic device is designed to withstand. For example, a transistor with a voltage rating of 50 V is designed for a 50 V difference between drain and source regions or electrodes or collector and emitter regions or electrodes when the transistor in an off-state. The transistor may be able to withstand a higher voltage, such as 60 V or 70 V, for a limited duration, such as during and shortly after a switching operation, without significantly permanently damaging the transistor.

Group numbers correspond to columns within the Periodic Table of Elements based on the IUPAC Periodic Table of Elements, version dated Nov. 28, 2016.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not explicitly listed or inherent to such method, article, or apparatus. Further, unless explicitly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A high electron mobility transistor (HEMT) can have a barrier layer between a gate electrode and a channel layer. The barrier layer can include an intermediate portion where electrons can be trapped, charge carriers can be recombined, or both. In an embodiment, the intermediate portion can act as a trap and recombination section of the barrier layer. The intermediate portion can be spaced apart from each of the gate electrode and the channel layer by other portions of the barrier layer. The intermediate portion can have a different composition or a different crystal defect density as compared to the other portions. The other portions can have a thickness to allow charge carriers to tunnel into the intermediate portion. The gate electrode may have a dopant concentration such that a Schottky contact is at the interface between the gate electrode and a gate interconnect. The HEMT can be an enhancement-mode and can have a $V_{TH}$ of at least 2 V and a subthreshold slope of at most 50 mV/decade of $I_{DS}$. Thus, the HEMT can allow for better control when turning on the HEMT.

In an aspect, an electronic device can include a HEMT that includes a channel layer, a barrier layer, and a gate electrode. The barrier layer can be disposed between the channel layer and the gate electrode and include a first portion, a second portion, and a third portion. The second portion can be spaced apart from the channel layer by the first portion, and the second portion is spaced apart from the gate electrode by the third portion. The second portion of the barrier layer can be configured to trap more charge, more readily recombine electrons and holes, or both as compared to each of the first and third portions of the barrier layer.

In another aspect, a method of using an electronic device can include coupling a source electrode of a HEMT to a first power supply. The HEMT can further include a drain electrode; a gate electrode; a channel layer underlying the source, drain, and gate electrodes; and a barrier layer including a first portion, a second portion, and a third portion. The second portion is disposed between first and third portions, and the second portion has a higher In content, a higher dopant concentration, or a higher crystal defect density as compared to the first and third portions. The method can further include coupling the drain electrode to a second power supply and increasing $V_{GS}$ to turn on the transistor, wherein the transistor has a subthreshold slope of at most 50 mV/decade of $I_{DS}$ over three decades of $I_{DS}$.

In a further aspect, a process can be used to form an electronic device including a HEMT. The process can include forming a barrier layer over a channel layer, wherein the barrier layer includes a first portion, a second portion, and a third portion, and the second portion is disposed between the first and third portions. The process can also include implanting ions into the barrier layer, such that the second portion has a higher dopant concentration or a higher crystal defect density after implanting is completed. The process can further include forming a gate electrode of the HEMT over the barrier layer. The second portion of the barrier layer is spaced apart from the channel layer by the first portion of the barrier layer, and the second portion of the barrier layer is spaced apart from the gate electrode by the third portion of the barrier layer.

Embodiments, including processes of forming and methods of using the HEMT, are described in more detail below in conjunction with the figures. After reading this specification, skilled artisans will appreciate that other embodiments that are not explicitly disclosed can be used without departing from the present invention as defined in the appended claims.

FIG. 1 includes a cross-sectional view of a portion of a workpiece 100 that can include a substrate 102, a strain-relief layer 104, a channel layer 106, a barrier layer 108, and a gate electrode layer 124. The substrate 102 can include silicon, sapphire (monocrystalline $Al_2O_3$), silicon carbide (SiC), aluminum nitride (AlN), gallium nitride (GaN), gallium oxide ($Ga_2O_3$), spinel ($MgAl_2O_4$), another suitable monocrystalline material, or the like. In an embodiment, the substrate 102 can be a monocrystalline semiconductor wafer. The selection of the particular material and crystal orientation along the primary surface can be selected depending upon the composition of the overlying semiconductor layers.

The strain-relief layer 104 is not required for all embodiments. For example, the strain-relief layer 104 may not be required when the substrate 102 and channel layer 106 include the same semiconductor base material, such as GaN. The strain-relief layer 104 can include a III-N material, and in a particular embodiment, include $Al_aGa_{(1-a)}N$, where $0 \leq a \leq 1$. The composition of the strain-relief layer 104 may depend on the composition of the semiconductor base material of the channel layer 106 and the voltage rating of the HEMT. The composition of the strain-relief layer 104 can be changed as a function of thickness, such that the strain-relief layer 104 has a relatively greater aluminum content closer to the substrate 102 and relatively greater gallium content closer to the channel layer 106. In a particular embodiment, the cation (metal atoms) content in the semiconductor base material of the strain-relief layer 104 near the substrate 102 can be 10 atomic % to 100 atomic % Al with the remainder Ga, and the cation content in the semiconductor base material of the strain-relief layer 104 near the channel layer 106 can be 0 atomic % to 50 atomic % Al with the remainder Ga. In another embodiment, the strain-relief layer 104 can include a plurality of films. The strain-relief layer 104 can have a thickness in a range from approximately 0.5 micron to 10 microns.

The channel layer 106 can include $Al_zGa_{(1-z)}N$, where $0 \leq z \leq 0.1$ and have a thickness in a range from approximately 10 nm to 4000 nm. In a particular embodiment, the channel layer 106 is a GaN layer (z=0). The channel layer 106 may be undoped, unintentionally doped or doped with an electron donor (n-type) dopant or an electron acceptor (p-type) dopant. A high density two-dimensional electron gas (2DEG) 202 can be formed near portions of the interface of the channel layer 106 and the barrier layer 108 and is responsible for high mobility and lower resistivity of the transistor structure when in the on-state. Any reduction of the electrons within the 2DEG 202 will increase the on-resistance of the transistor. In an embodiment, the concentration of acceptors or donors may be kept as low as reasonably possible.

In a particular embodiment, acceptors can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and, such carbon can result in unintentional doping. The carbon content may be controlled by controlling the deposition conditions, such as the deposition temperature and flow rates. In an embodiment, the channel layer 106 has a carrier impurity concentration that is greater than 0 and at most $1 \times 10^{17}$ atoms/cm$^3$. In a particular embodiment, the carrier impurity concentration is in a range from $1 \times 10^{15}$ atoms/cm$^3$ to $5 \times 10^{16}$ atoms/cm$^3$.

In an embodiment, the channel layer 106 has a thickness that is at least 50 nm. When the thickness is less than 50 nm, the 2DEG 202 may be more difficult to generate, maintain, or both. In another embodiment, the channel layer 106 has a thickness that is at most 5000 nm. In a particular embodiment, the thickness in a range from 50 nm to 300 nm can provide a sufficiently thick channel layer 106 to allow for the proper generation and maintaining of the 2DEG 202 and still obtain a reasonable value for RDSON. Although not illustrated, a spacer layer may be used between the channel and barrier layers 106 and 108 if desired.

The barrier layer 108 can include a lower portion 1082, an intermediate portion 1084, and an upper portion 1086. The intermediate portion 1084 is disposed between lower and upper portions 1082 and 1086. The channel layer 106 can be closer to the lower portion 1082 than to each of the intermediate and upper portions 1084 and 1086. In the embodiment as illustrated in FIG. 1, the lower portion 1082 is adjacent to and lies along a surface of the channel layer 106, and the upper portion 1086 is adjacent to and lies along a surface of the gate electrode layer 124.

The intermediate portion 1084 can trap charge carriers, recombine electrons and holes, or both. In an embodiment, the intermediate portion 1084 may be referred to as a trap and recombination section (T&RS). As will be described later in this specification, the T&RS can help to increase the threshold voltage ($V_{TH}$) and subthreshold slope of the HEMT. In an embodiment, the thickness of the intermediate portion 1084 can be in a range from 1 nm to 30 nm. The intermediate portion 1084 is spaced apart from the channel layer 106 by the lower portion 1082 and is spaced apart from the gate electrode layer 124 by the upper portion 1086. Each of the lower and upper portions 1082 and 1086 may have a thickness sufficient for charge carriers to tunnel into the intermediate portions 1084. In an embodiment, the lower and upper portions 1082 and 1086 can have a thickness of at least 2 nm or at least 5 nm, and in another embodiment, the lower and upper portions 1082 and 1086 can have a thickness of at most 25 nm or at most 20 nm. In a particular embodiment, the lower and upper portions 1082 and 1086 can have a thickness in a range from 5 nm to 15 nm. In an embodiment, the intermediate portion 1084 may be located within the middle of the barrier layer 108. The portions 1082 and 1086 can have the same thickness. In another embodiment, the intermediate portion 1084 may not be located within the middle of the barrier layer 108. Thus, the portions 1082 and 1086 can have thicknesses are that significantly different from each other. The thickness of the barrier layer 108 can be in a range from 5 nm to 34 nm.

In an embodiment, the intermediate portion 1084 can have a different composition as compared to the lower and upper portions 1082 and 1086. In a particular embodiment, the intermediate portion 1084 can have a different semiconductor base material as compared to the lower and upper portions 1082 and 1086, or the intermediate portion 1084 can have a higher dopant concentration as compared to the lower and upper portions 1082 and 1086. In a further embodiment, the intermediate portion 1084 can have a higher crystal defect density as compared to the lower and upper portions 1082 and 1086.

With respect to different semiconductor base materials, each of the portions 1082, 1084, and 1086 can include a III-V semiconductor base material, such as a III-N semiconductor base material. In an embodiment, the intermediate portion 1084 can include a higher In content as compared to the portions 1082 and 1086. The intermediate portion 1084 may also include Al, Ga, or both. In a particular embodiment, the intermediate portion 1084 includes $In_fAl_gGa_{(1-f-g)}N$, where $0 < f \leq 1.0$, $0 \leq g < 1.0$, and $(f+g) \leq 1.0$. In another particular embodiment, the lower and upper portions 1082 and 1086 include $Al_zGa_{(1-z)}N$, where $0.1 \leq z \leq 0.5$. The lower and upper portions 1082 and 1086 may have the same or different semiconductor base materials as compared to each other.

With respect to different dopant concentrations, the intermediate portion 1084 can have a higher dopant concentration as compared to the portions 1082 and 1086. The dopant can include an n-type dopant, such as Si, O, or the like, or a p-type dopant such as Mg, Be, Zn, Cd, or the like. The dopant concentration can be in a range from $1 \times 10^{15}$ atoms/cm$^3$ to $1 \times 10^{19}$ atoms/cm$^3$. The dopant for the intermediate portion 1084 may be incorporated during growth of the portion 1084, or the intermediate portion 1084 may be ex-situ doped before or after forming the portion 1086. The portions 1082 and 1086 can be undoped or unintentionally doped. With respect to unintentionally doped, some carbon can become incorporated as the portions 1082 and 1086 are grown, and, such carbon can result in unintentional doping. The carbon content may be controlled by controlling the deposition conditions, such as the deposition temperature and flow rates. In an embodiment, the portions 1082 and 1086 have a dopant concentration that is greater than 0 and at most $5 \times 10^{16}$ atoms/cm$^3$. In a particular embodiment, the portions 1082 and 1086 have a dopant concentration in a range from $1 \times 10^{14}$ atoms/cm$^3$ to $1 \times 10^{16}$.

With respect to different crystal defect densities, the intermediate portion 1084 can have a higher crystal defect density as compared to the portions 1082 and 1086. The crystal damage can be caused by implanting ions into the barrier layer 108. The projected range for the implanted ions can be targeted for the intermediate portion 1084. The ions can be a dopant or be generated from a noble gas, such as He, Ne, Ar, or the like. The crystal defect density can be in a range from 1 defect/cm$^3$ to $1 \times 10^6$ defects/cm$^3$. In an embodiment, portions 1082 and 1086 may have at most $1 \times 10^5$ defects/cm$^3$. In an embodiment, the portions 1082 and 1086 have a crystal defect density in a range from 1 defect/cm$^3$ to $1 \times 10^3$ defects/cm$^3$. In a particular embodiment, the intermediate portion 1084 is not annealed at a temperature greater than 900° C. after formation of the intermediate portion 1084 to ensure at least some of the crystal damage is sufficiently high in the finished electronic device to allow the intermediate portion 1084 to be a T&RS.

In other embodiment, an alternative construction for the barrier layer may be used. Some alternative constructions are described later in this specification.

The gate electrode layer 124 overlies the barrier layer 108. The gate electrode layer 124 can include a p-type semiconductor material. In an embodiment, the p-type semiconductor material can include p-type doped Al$_c$Ga$_{(1-c)}$N wherein $0 \leq c \leq 0.5$. In an embodiment, the gate electrode layer 124 can include p-type GaN. The p-type dopant can include Mg, Zn, Cd, or the like. The p-type semiconductor material can be monocrystalline or polycrystalline. The gate electrode layer 124 can have a dopant concentration of at least $1 \times 10^{17}$ atoms/cm$^3$. In another embodiment, the dopant concentration is at most $5 \times 10^{19}$ atoms/cm$^3$. The p-type dopant can be incorporated in-situ or introduced into the gate electrode layer after deposition. The gate electrode layer 124 can have a thickness in a range from 20 nm to 300 nm.

The strain-relief layer 104, the channel layer 106, the barrier layer 108, and the gate electrode layer 124 can be formed using an epitaxial growth technique. In an embodiment, all of the layers 104, 106, 108, and 124 can be epitaxially grown in a sequence without exposing any of the layers 104, 106, and 108 to air. In another embodiment, the workpiece can be exposed to air before all layers are formed. For example, the workpiece may be removed from a deposition chamber after forming some, but not all, of the layers as illustrated in FIG. 1 and before placing the workpiece in the same or different deposition chamber for one or more of the other layers as illustrated in FIG. 1. An alternative process flow is described later in this specification. Any one or more layers as illustrated in FIG. 1 can be monocrystalline. In a particular embodiment, the layers in FIG. 1 can be formed using metalorganic chemical vapor deposition.

Figure 2:
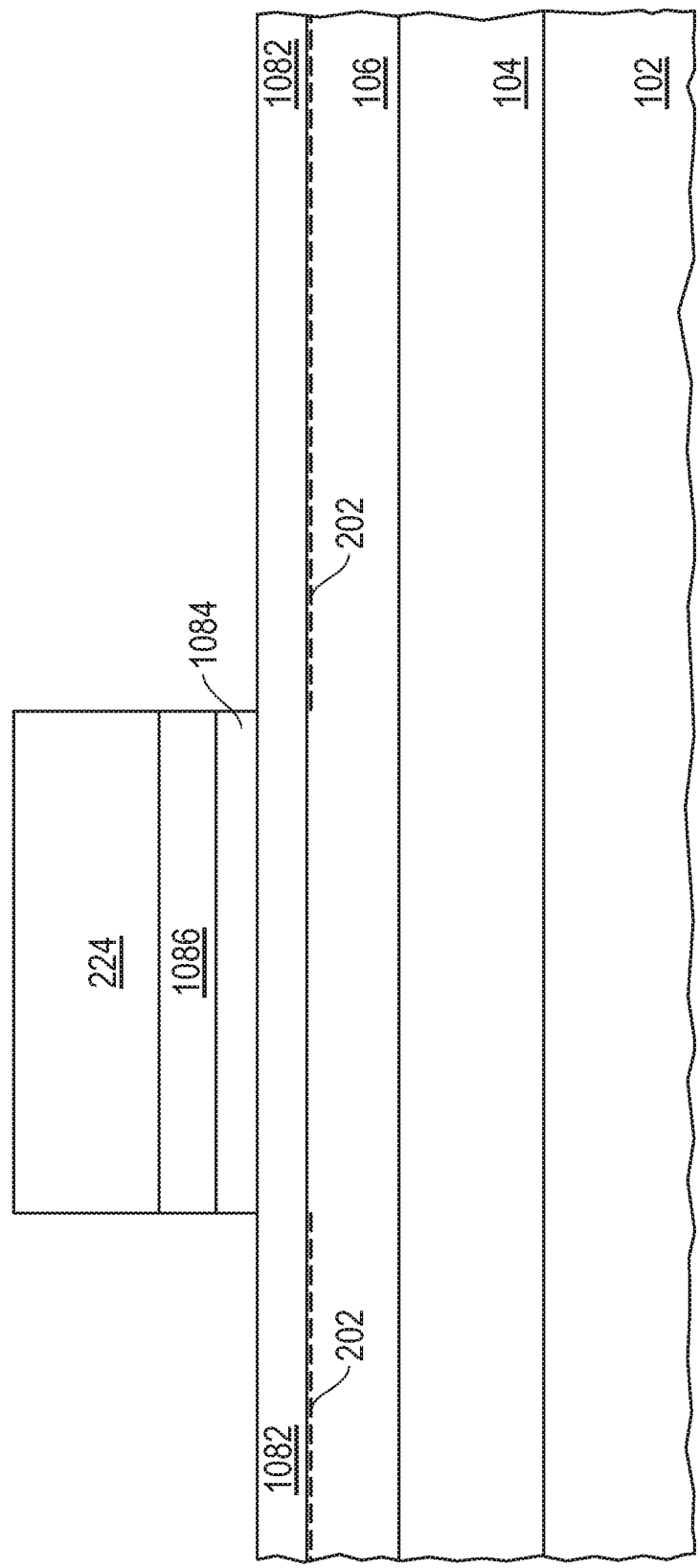
FIG. 2 includes an illustration of a cross-sectional view of the workpiece of FIG. 1 after patterning portions of the barrier layer and the gate electrode layer.

The gate electrode layer 124 and at least a portion of the barrier layer 108 can be patterned as illustrated in FIG. 2. A portion of the gate electrode layer 124 lying outside the gate region can be removed using a technique that does not significantly etch the barrier layer 108. When the gate electrode layer 124 includes p-type GaN, the gate electrode layer can be dry etched using a combination of a fluorine chemistry, such as SF$_6$, CHF$_3$, NF$_3$, or the like, and a chlorine chemistry, such as BCl$_3$, HCl, Cl$_2$, or the like. Aluminum-containing films or layers are not significantly etched using a fluorine chemistry, as AlF$_3$ forms and stops further etching of the aluminum-containing films or layers. After a gate electrode 224 is formed, the etch chemistry can be changed to remove the intermediate portion 1084 and the upper portion 1086 of the barrier layer 108. The etch chemistry can include the chlorine chemistry without the fluorine chemistry, or wet etched using a base, such as tetramethyl ammonium hydroxide ((CH$_3$)$_4$)NOH or TMAH), KOH, NaOH, or the like.

When the intermediate portion 1084 has a different composition as compared to the lower portion 1082, endpoint detection can be used to signal when the lower portion 1082 becomes exposed. For example, the intermediate portion 1084 may include In or a dopant element that is not present in the lower portion 1082. When the signal for In or the dopant element indicates In or the dopant element is no longer significantly present in the etch effluent gas stream, the etch can be terminated, or a timed overetch may be used in order to account for thickness non-uniformity across the workpiece.

As illustrated in FIG. 2, the 2DEG 202 is discontinuous and lies to the right and left of the gate electrode 224 but not under the gate electrode 224. The transistor structure being formed is an enhancement-mode HEMT.

Figure 3:
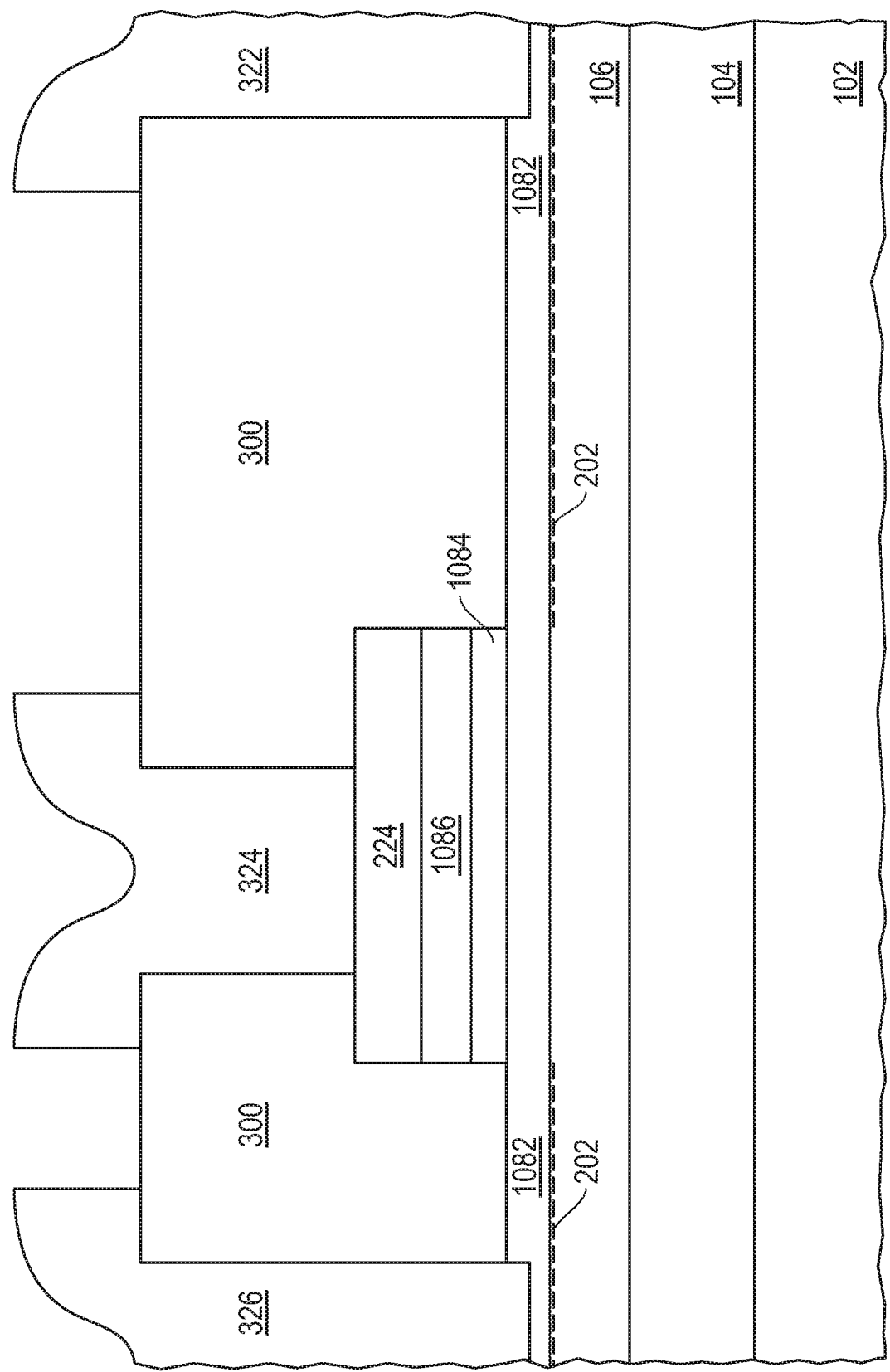
FIG. 3 includes an illustration of a cross-sectional view of the workpiece of FIG. 2 after forming an interlevel dielectric layer and electrodes and a gate interconnect.

An interlevel dielectric (ILD) layer 300, a drain electrode 322, a gate interconnect 324, and a source electrode 326 can be formed as illustrated in FIG. 3. The ILD layer 300 can be formed over the lower portion 1082 of the barrier layer 108 and the gate electrode 224. The ILD layer 300 can include a single film or a plurality of films. The single film or each of the films can include an oxide, a nitride, or an oxynitride. The ILD layer 300 can have a thickness in a range from 20 nm to 5000 nm.

The ILD layer 300 can be patterned to define contact openings for the drain electrode 322, gate interconnect 324, and the source electrode 326. The contact openings for the drain and source electrodes 322 and 326 can extend through the ILD layer 300. In the embodiment as illustrated in FIG. 3, the contact openings for the drain and source electrodes 322 and 326 can extend through part, but not all, of the thickness of the lower portion 1082 of the barrier layer 108. In another embodiment, the contact openings for the drain and source electrodes 322 and 326 can land on the lower portion 1082 or extend through all of the thickness of the lower portion 1082 and contact the channel layer 106. The contact opening for the gate interconnect 324 can extend through the ILD layer 300 and land on or extend no more than a few nm (e.g., $\leq 3$ nm) into the gate electrode 224.

A conductive layer is formed over the ILD layer 300 and within the contact openings. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices.

The conductive layer is patterned to form the drain electrode 322, the gate interconnect 324, and the source electrode 326. In another embodiment, defining the contact opening for the gate interconnect 324, formation of the gate interconnect 324, or both may be performed during the same process sequence or during different time as compared to the contact openings for the drain and source electrodes 322 and 326, or the formation of the drain and source electrodes 322 and 326. In an embodiment, the gate interconnect 324 and its corresponding contact opening may be formed at a different interconnect level as compared to the drain and source electrodes 322 and 326 and have a different composition.

One or more additional interconnect levels and a passivation layer may be formed over the workpiece. One or more field electrodes may be formed over a portion of the channel layer 106 can be used to control electrical fields within the barrier layer 108 and other parts of the workpiece under the barrier layer 108. Each field electrode may be electrically connected to the drain electrode 322, the gate interconnect 324, or the source electrode 326. Each interconnect level can include an ILD layer and interconnects. A conductive layer can be used at each interconnect level. The conductive layer may be the same or different from the other conductive layers described earlier in this specification. A substantially completed electronic device has been formed.

Figure 4:
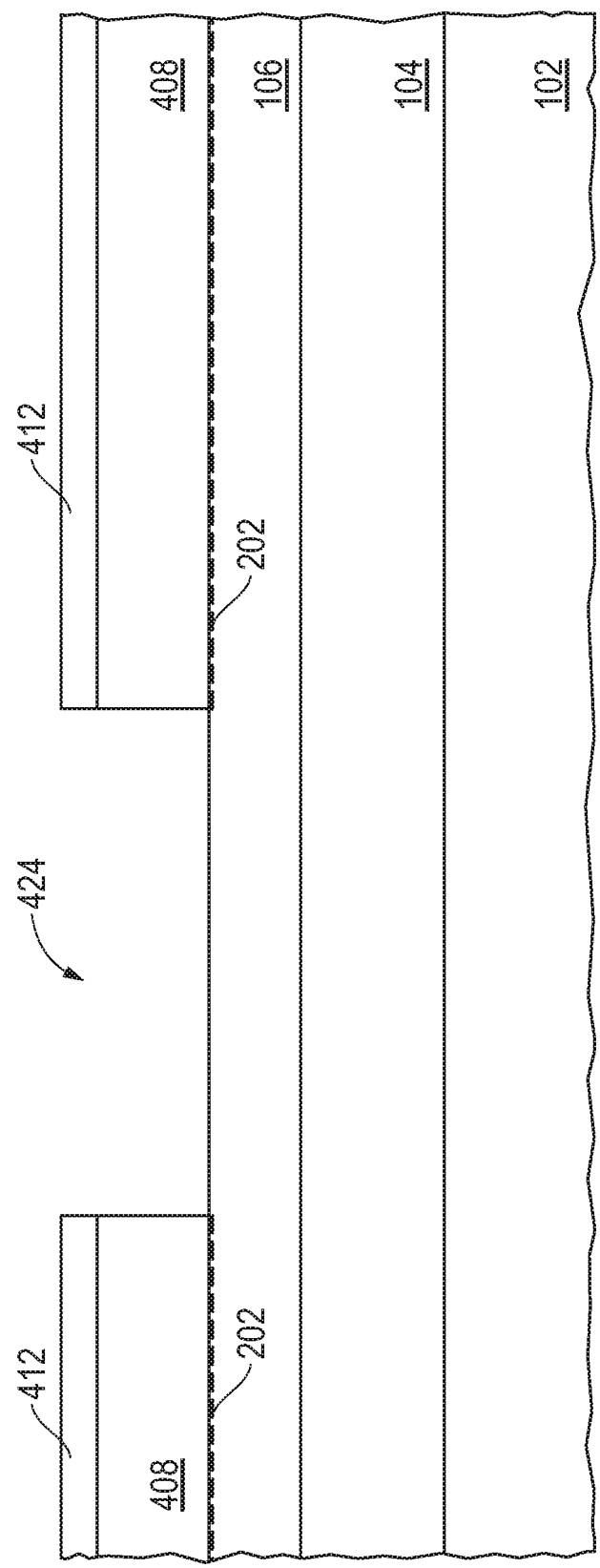
FIG. 4 includes an illustration of a cross-sectional view of a portion of a workpiece including a substrate, a strain-relief layer, a channel layer, and a barrier layer in accordance with another embodiment.

In another embodiment, the timing for the formation of a barrier layer and gate electrode may be changed. FIG. 4 includes an illustration of a portion of a workpiece after a barrier layer 408 and a passivation layer 412 are formed and patterned to define an opening 424.

The composition and thickness of the barrier layer 408 can be selected to achieve a desired RDSON. The barrier layer 408 can include a III-V semiconductor material, such as a III-N semiconductor material. In a particular embodiment, the access region can include $Al_xIn_yGa_{(1-x-y)}N$, wherein $0<x\leq0.6$, $0\leq y\leq0.3$, and $0<(x+y)\leq1$. The barrier layer 408 can be undoped or be unintentionally doped. Thus, the barrier layer 408 may have any of the dopant concentrations as previously described with respect to the channel layer 106. The barrier layer 408 can include a single film or a plurality of films. When the barrier layer 408 includes a plurality of films, the aluminum content can remain substantially the same or increase or decrease as distance from the channel layer 106 increases. As the aluminum content in the barrier layer 408 increases or decreases, the thickness of the barrier layer 408 may be relatively thinner. In an embodiment, the barrier layer 408 has a thickness of at least 5 nm, and in another embodiment, the barrier layer 408 has a thickness of at most 150 nm. In a particular embodiment, the barrier layer 408 has a thickness in a range from 10 nm to 90 nm.

The passivation layer 412 is optional and may be used to protect the barrier layer 408 during processing when patterning the barrier layer 408 or subsequently forming the barrier layer 108, gate electrode 224, or both. The passivation layer 412 can include an oxide, a nitride, or an oxynitride. In an embodiment, the passivation can have a thickness in a range from 2 nm to 100 nm. Other thicknesses may be used if needed or desired for a particular application.

The barrier layer 408 and the passivation layer 412 can be formed during the same deposition sequence, such that the workpiece is not exposed to air until after the passivation layer 412 is formed. In a particular embodiment, the barrier layer 408 can be epitaxially grown from the channel layer 106. The passivation layer 412 can be blanket deposited over the barrier layer 408.

The barrier layer 408 and the passivation layer 412 are patterned to define the opening 424 where the barrier layer 108 will be subsequently formed. In embodiment, the barrier layer 408 has a higher Al content than the channel layer 106, and thus, endpoint detection may be used to determine when the channel layer 106 becomes exposed. A timed overetch may be used if needed or desired.

Figure 5:
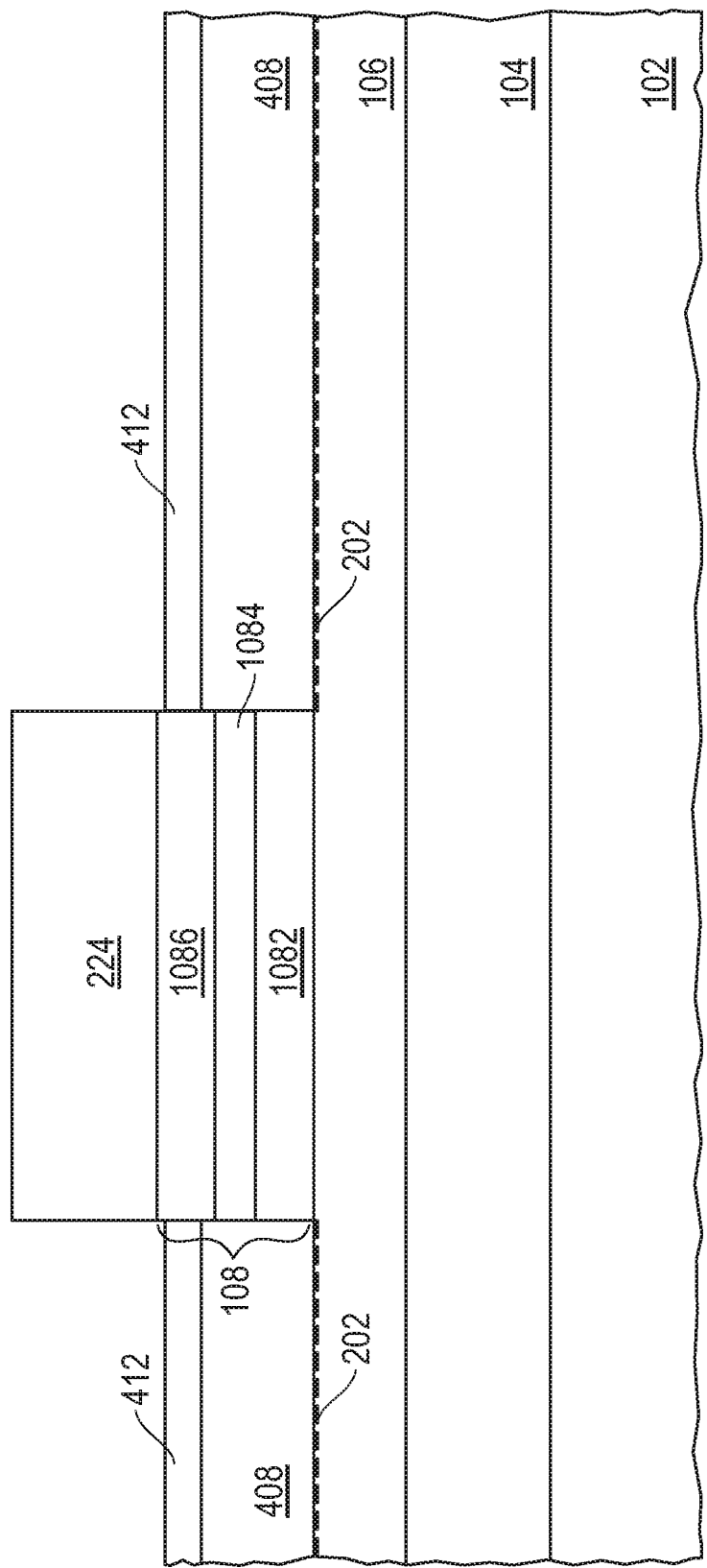
FIG. 5 includes an illustration of a cross-sectional view of the workpiece of FIG. 4 after forming another barrier layer and a gate electrode in accordance with another embodiment.

FIG. 5 includes the portion of the workpiece after forming the barrier layer 108 and gate electrode 224. The barrier layer 108 is formed within the opening 424. The barrier layer 108 includes the portions 1082, 1084, and 1086. The composition and thicknesses of the portions 1082, 1084, and 1086 are described above. In an embodiment, the barrier layer 108 is formed using a selective growth technique, where the barrier layer 108 is grown within the opening 424. No significant deposition of the barrier layer 108 occurs at locations spaced apart from the opening 424, for example, at locations where the source and drain electrodes will be subsequently formed. In another embodiment, the barrier layer 108 can be deposited over all of the transistor structure being formed, and the barrier layer 108 can be etched to remove portions overlying the barrier layer 408. The barrier layer 408 can have the same or different composition as compared to portions 1082 or 1086 of the barrier layer 108. The gate electrode 224 can be formed over barrier layer 108 as previously described.

Figure 6:
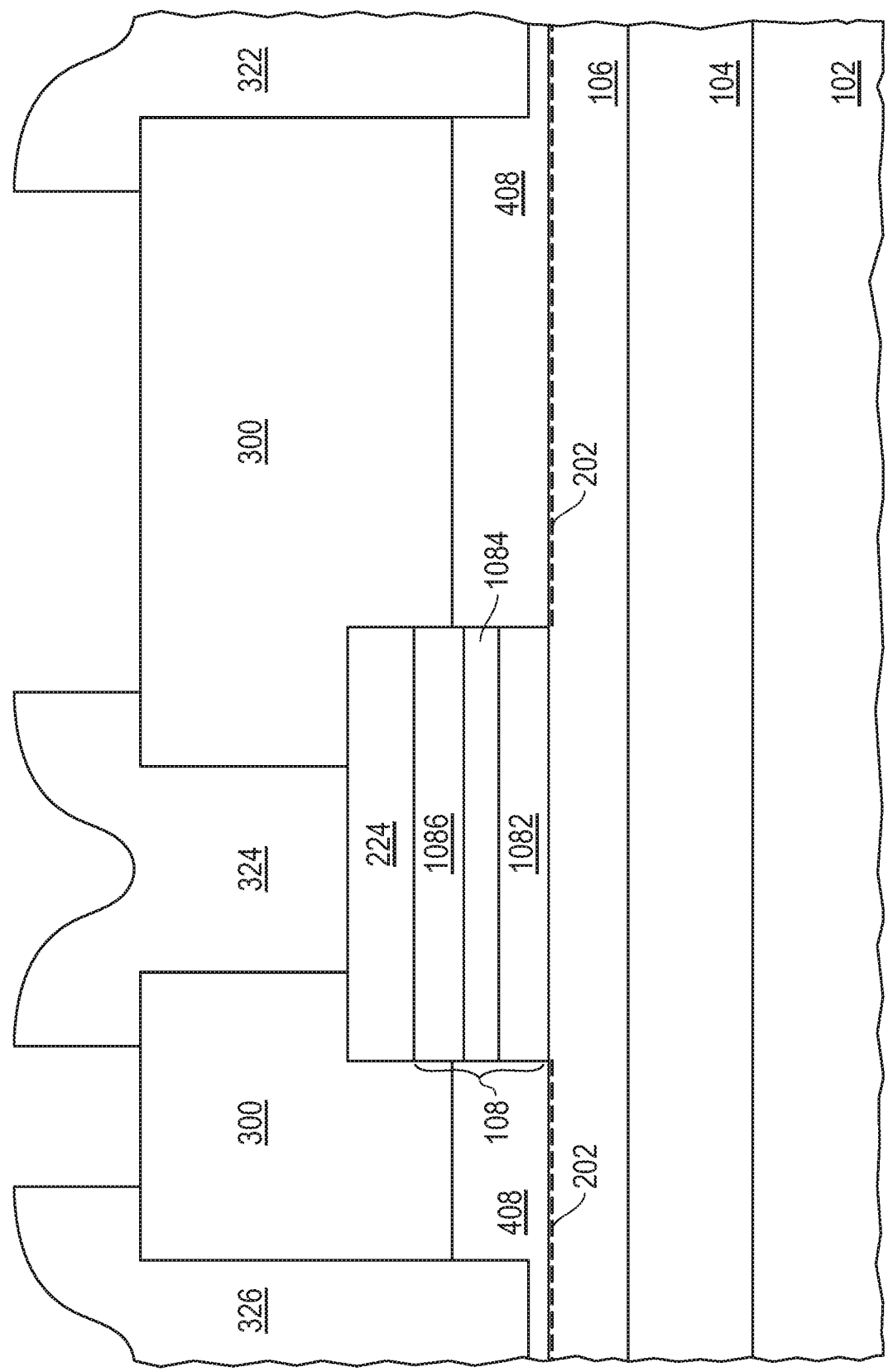
FIG. 6 includes an illustration of a cross-sectional view of the workpiece of FIG. 5 after forming an interlevel dielectric layer and electrodes and a gate interconnect.

FIG. 6 includes the portion of the workpiece after forming the ILD layer 300, the drain electrode 322, the gate interconnect 324, and the source electrode 326. The ILD layer 300, the drain electrode 322, the gate interconnect 324, and source electrode 326 can be formed as previously described. The drain and source electrodes 322 and 326 can land on the barrier layer 408, extend through part and not all of the barrier layer 408, or extend completely through the barrier layer 408 and land on the channel layer 106.

Figure 7:
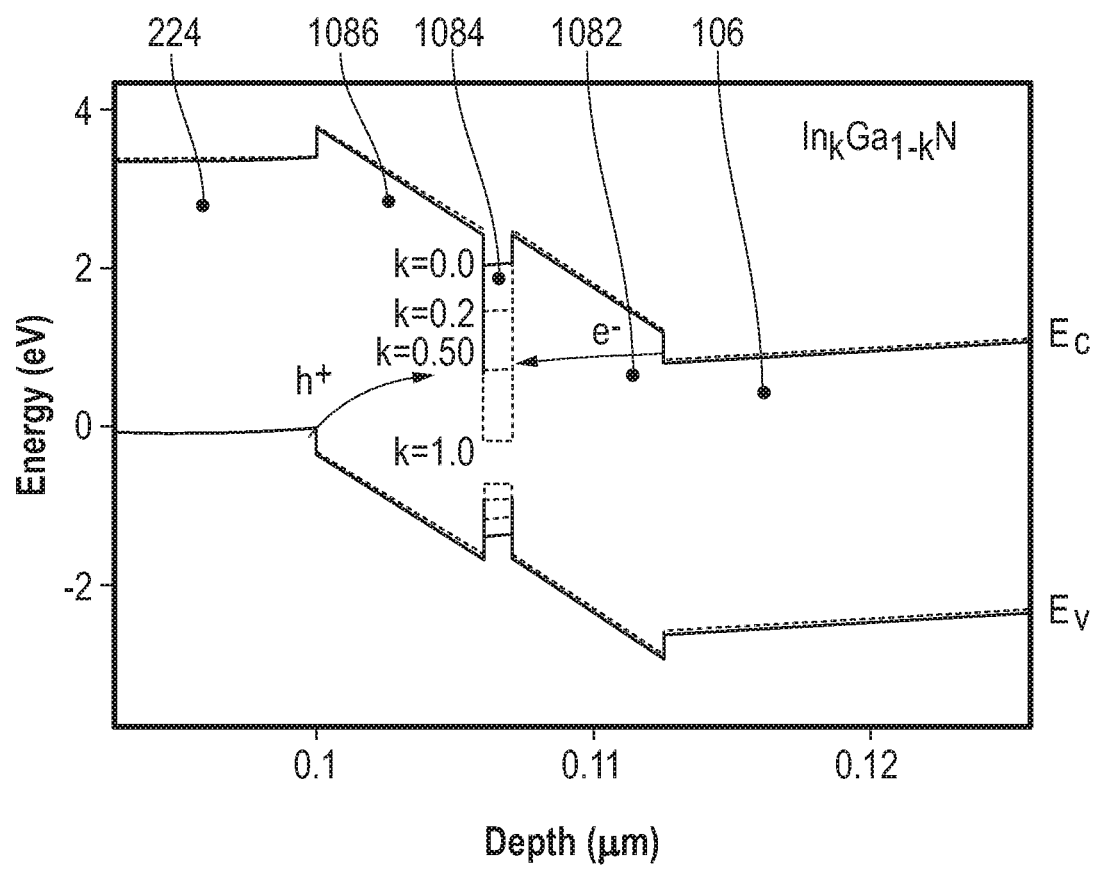
FIG. 7 includes an energy band diagram for a portion of the workpiece of FIG. 6 in accordance with an embodiment.

Other formation sequences may be used in other embodiments. For example, the barrier layer 408 may be formed after the barrier layer 108 and gate electrode 224 are formed. In another embodiment, the passivation layer 412 may not be used, and the barrier layer 108 may be formed within the opening 424 and over the barrier layer 408. In another embodiment, all of the barrier layer 108 overlying the barrier layer 408 may be removed. Alternatively, portions 1084 and 1086 of the barrier layer 108 may be removed, and at least part of the portion 1082 may remain over the barrier layer 408. After reading this specification, skilled artisans will be able to determine a sequence for forming the transistor structure to meet the needs or desires FIG. 7 includes an energy band diagram for the structure illustrated in FIG. 6. The portion 1084 in FIG. 7 includes $In_kGa_{(1-k)}N$, wherein $0\leq k\leq1$. The band offset of the portion 1084 with respect to portions 1086 and 1082 is determined by the amount of In in layer 1084. More In will result in a lower level for the T&RS (portion 1084) in the bandgap.

Figure 8:
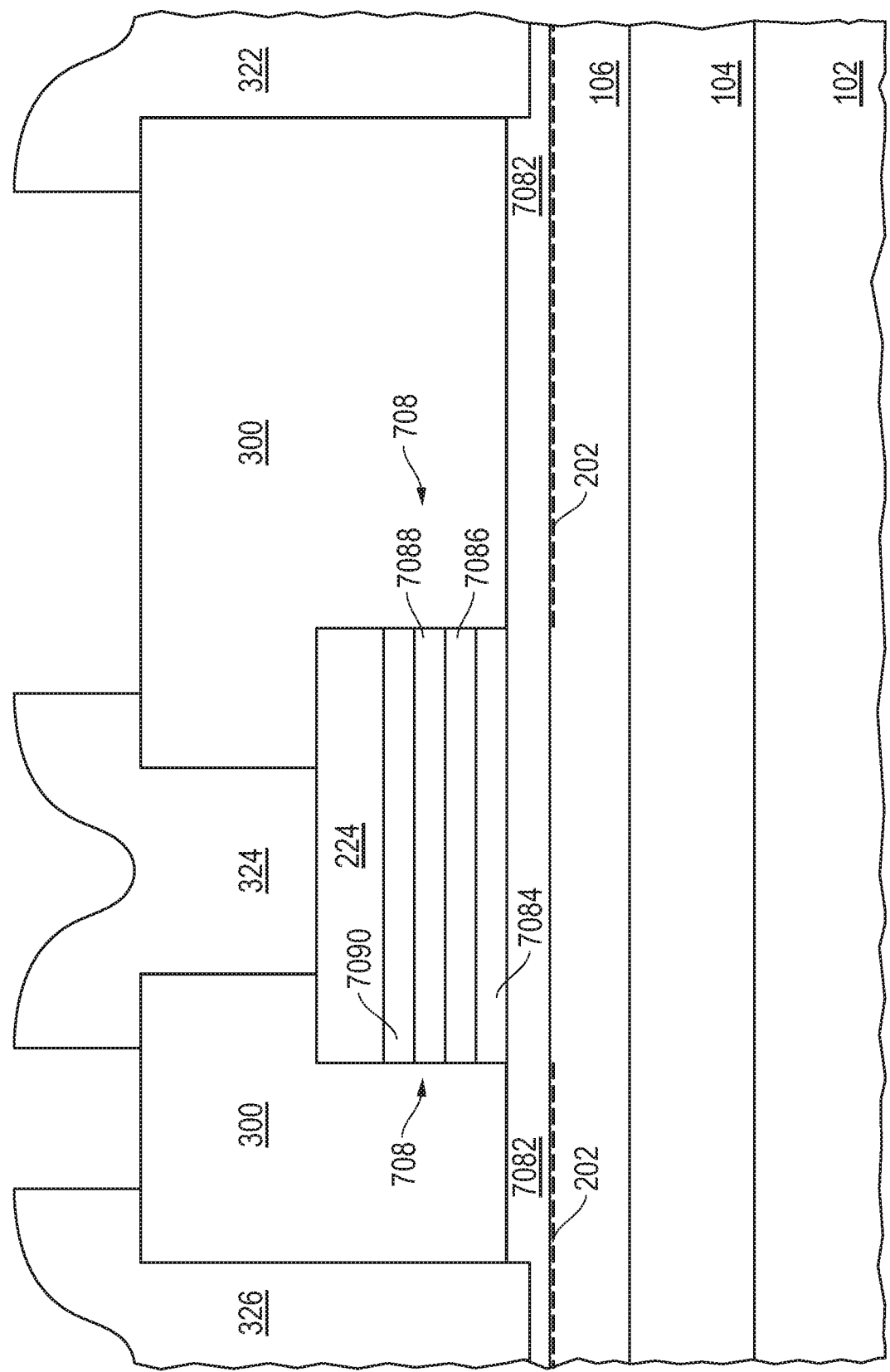
FIG. 8 includes an illustration of a cross-sectional view of a portion of a workpiece including a barrier layer in accordance with a further embodiment.

In another embodiment, another construction may be used for the barrier layer under the gate electrode 224. FIG. 8 includes an illustration where the barrier layer 708 is between the channel layer 106 and the gate electrode 424. The barrier layer 708 includes portions 7082, 7084, 7086, 7088, and 7090. The portions 7084 and 7088 can provide any of the functions as previously described with respect to the portion 1084 of the barrier layer 108. The portions 7084 and 7088 can have any of the compositions and thicknesses as previously described with respect to the portion 1084 of the barrier layer 108. The portions 7084 and 7088 can have the same composition or different compositions as compared to each other and can have the same thickness or different thicknesses as compared to each other. The portions 7082, 7086 and 7090 can have any of the compositions and thicknesses as previously described with respect to the portions 1082 and 1086 of the barrier layer 108. Any pair of the portions 7082, 7086, and 7090 can have the same composition or different compositions as compared to each other and can have the same thickness or different thicknesses as compared to each other. In further embodiments, the barrier layer 708 can include more portions that can act as T&RSs (portions 1084, 7084, and 7088). Regardless of the number T&RSs, all of the T&RSs are spaced apart from channel layer 106 and the gate electrode 224. Other portions, such as portions 7082, 7086, 7082, and 7090, lie along the channel layer 106 or the gate electrode 224. The portion 7084 is spaced apart from the channel layer 106 by the portion 7082, and the portion 7088 is spaced apart from the gate electrode 224 by the portion 7090. Thus, other portions are disposed between the T&RSs and the channel layer 106 or the gate electrode 224.

Any of the HEMTs as previously described can be used as a switch that can be turned on and off. The drain electrode 322 or the source electrode 326 can be coupled to a power supply, and the other of the drain electrode 322 and the source electrode 326 can be coupled to another power supply or an output node. $V_{GS}$ can be increased to turn on the HEMT, and $V_{GS}$ can be decreased to turn off the HEMT.

Figure 9:
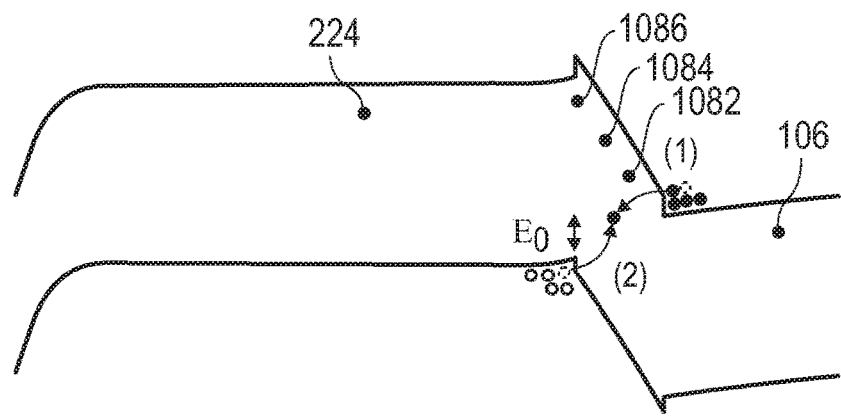
FIG. 9 includes an illustration of energy diagrams for a transistor with an embodiment as disclosed herein when the gate-to-source voltage is 0 V.
Figure 10:
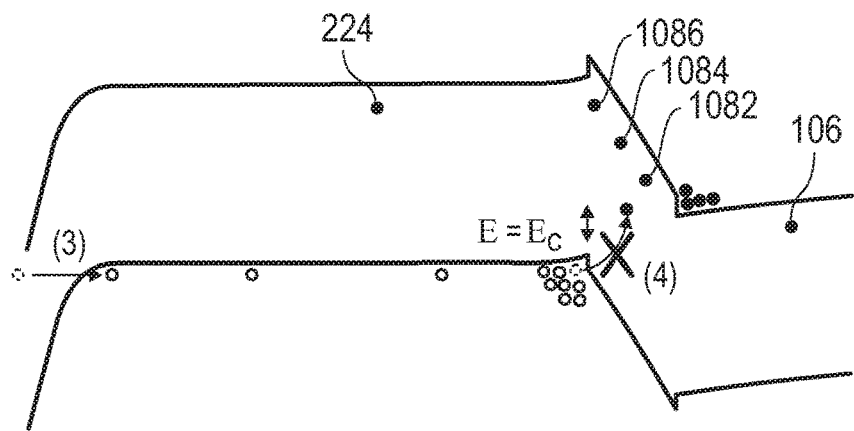
FIG. 10 includes an illustration of energy diagrams for a transistor with an embodiment as disclosed herein when the gate-to-source voltage is between 0 V and the threshold voltage of the transistor.
Figure 11:
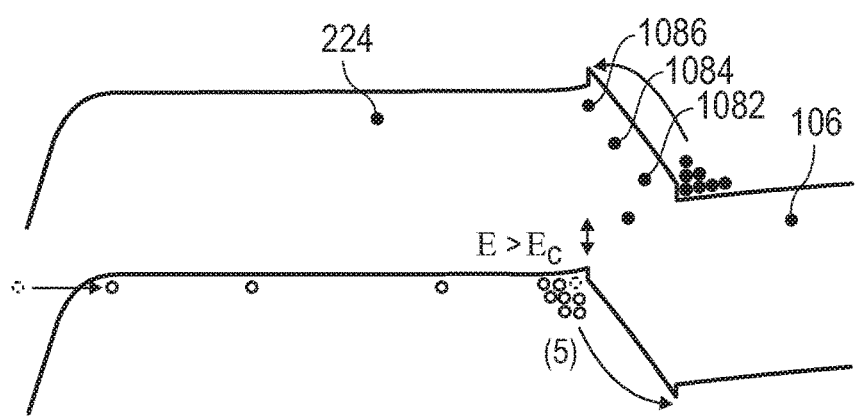
FIG. 11 includes an illustration of energy diagrams for a transistor with an embodiment as disclosed herein when the gate-to-source voltage is at or above the threshold voltage of the transistor.

Embodiments as described herein can help to increase $V_{TH}$ and subthreshold slope of the HEMT. Although not to be bound by theory, FIGS. 9 to 11 include energy diagrams to illustrate what happens to charge carriers when the HEMT is off and as it turns on. The combination of the gate electrode 224 (for example, p-type GaN), the barrier layer 108, and channel layer 106 forms a p-i-n diode. Referring to FIG. 9, when the gate-to-source voltage ($V_{GS}$)>0, electrons can be injected into the barrier layer 108 (#1 in FIG. 9) and recombine with holes in the barrier layer 108 (#2 in FIG. 9). As the recombination occurs, there is no potential build-up across the p-i-n diode. The voltage at the gate electrode 224 does not change, and the HEMT remains off. Referring to FIG. 10, as $V_{GS}$ increases further, holes can be injected from the Schottky contact (gate interconnect 324) (#3 in FIG. 10). The holes accumulate in a two-dimensional hole gate (2DHG) within gate electrode 224 at a region close to barrier layer 108 and slightly increase the potential at such region (#4 in FIG. 10). Hole recombination through trap assisted tunneling stops when the increase in potential is such that E≥Ec. Referring to FIG. 11, a further increase in gate interconnect 324 potential will result in hole accumulation in the 2DHG within nanoseconds (#5 in FIG. 11). The subsequent forward biasing of the p-i-n diode causes the HEMT to turn on abruptly to provide a significantly higher subthreshold slope as compared to conventional enhancement-mode HEMTs.

A HEMT with a previously described barrier layer between the gate electrode 224 and channel layer 106 can have a $V_{TH}$ and subthreshold slope significantly greater than a $V_{TH}$ and subthreshold slope for a conventional HEMT. The conventional HEMT can have a barrier layer, such as the barrier layer 408, disposed between the gate electrode 224 and the channel layer 106, instead of the barrier layer 108 or 708 that have one or more T&RS portions. The conventional HEMT has a $V_{TH}$ in a range from 0.5 V to 1.9 V. Embodiments of HEMTs as described herein can have a $V_{TH}$ of at least 2.0 V, at least 2.2 V or at least 2.5 V. $V_{TH}$ does not need to be too high, and thus, $V_{TH}$ may be at most 5.0 V, at most 4.5 V, or at most 4.0 V. In a particular embodiment, $V_{TH}$ can be in a range from 2.4 V to 4.0 V.

The subthreshold slope is measured to be 18 mV/dec. The subthreshold slope is defined as the minimum change in $V_{GS}$ that is required to increase $I_{DS}$ by 4 decades, from $I_{DS}$=1× $10^{-8}$ A/mm to $I_{DS}$=1×$10^{-4}$ A/mm, see FIG. 11. The subthreshold slope can be expressed as a change in $V_{GS}$ per a change $I_{DS}$. Thus, a smaller value corresponds to a steeper subthreshold slope. The conventional HEMT has a subthreshold slope of at least 80 mV per decade of $I_{DS}$ (80 mV/dec). Embodiments of HEMTs as described herein can have a subthreshold slope of at most 50 mV/dec, at most 35 mV/dec, or at most 20 mV/dec. In a particular embodiment, the subthreshold slope may be at least 10 mV/dec. Any one or more of the subthreshold slopes may extend over three decades of $I_{DS}$, five decades of $I_{DS}$, six or even more decades of $I_{DS}$.

Embodiments as described herein may exhibit hysteresis when the HEMTs are turned on and off. As compared to turning on, the HEMTs may turn off more slowly. However, such hysteresis is not a significant problem. When turning off the HEMT, a turn-off slope can be expressed as a change in $V_{GS}$ per a change in $I_{DS}$. Similar to subthreshold slope, a smaller value corresponds to a steeper turn-off slope. Embodiments of HEMTs as described herein can have a subthreshold slope of at least 110 mV/dec, at least 150 mV/dec, or at least 300 mV/dec. In a particular embodiment, the subthreshold slope may be at most 900 mV/dec. Thus, with the turn-off slopes provided above, reasonable times for turning off the HEMT can be achieved.

Figure 12:
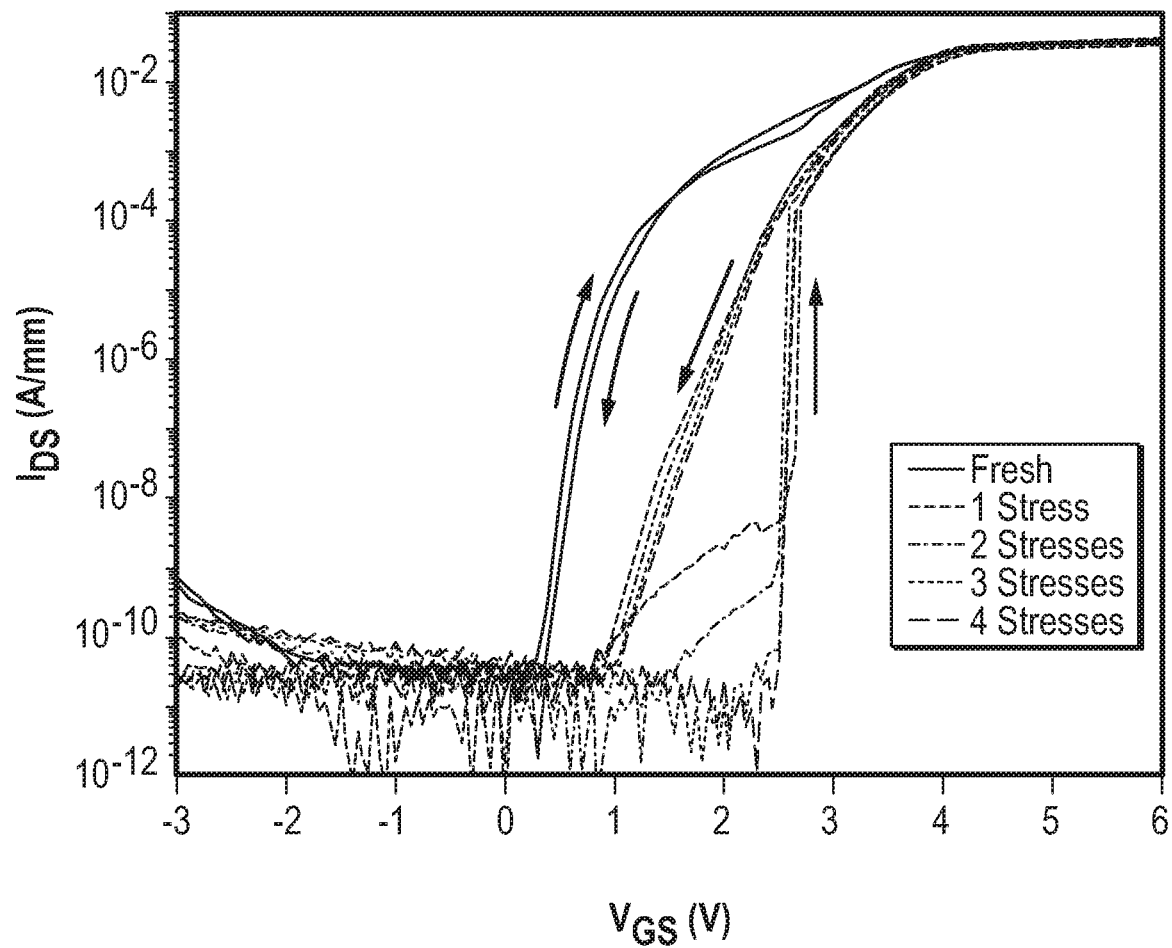
FIG. 12 includes an illustration of plots of drain-to-source current as a function of gate-to-source voltage for a HEMT as described herein before and after stressing the HEMT.

FIG. 12 includes plots of $I_{DS}$ as a function of $V_{GS}$ before and after stressing a HEMT as previously described. For the plots, $V_{DS}$ was 0.5 V, and $V_{GS}$ was ramped from −3 V to 6 V and then back to −3 V. Upward pointing arrows correspond to plots where $V_{GS}$ increases, and downward pointing arrows correspond to plots where $V_{GS}$ decreases. Before stressing ("fresh" in FIG. 12), the HEMT has a $V_{TH}$ that is less than 1 V. Each occurrence of stressing was performed at $V_{DS}$=200 V and $V_{GS}$=0 V for 10 s. After stressing the HEMT for the first occurrence ("1 stress" in FIG. 12), $V_{TH}$ and subthreshold slope significantly improves. $V_{TH}$ is 2.5 V, and the subthreshold slope is 18 mV/dec. Similar characteristics can be obtained for stressing at lower $V_{DS}$, e.g. $V_{DS}$=20 V.

After the second occurrence of stressing ("2 stresses" in FIG. 12) of the HEMT, when $V_{GS}$ is ramped from 1 V to 2.3 V, $I_{DS}$ is significantly reduced as compared to the HEMT after the first occurrence of stressing (1 stress in FIG. 12). The HEMT can be subjected to stressing for a third and fourth occurrences ("3 stresses" and "4 stresses" in FIG. 12), where stressing is performed at the voltages and times previously described. I-V data can be obtained after each occurrence of stressing. With respect to the third and fourth stressing occurrences, when $V_{GS}$ is ramped from 1 V to 2.3 V, $I_{DS}$ is significantly reduced as compared to the HEMT after the second occurrence of stressing (2 stresses in FIG. 12). The data show that the decrease in $I_{DS}$ between the third and fourth stressing occurrences are insignificant. After reading this specification, skilled artisans can determine stressing conditions and occurrences of stressing to be performed to reduce $I_{DS}$ when ramping $V_{GS}$ toward $V_{TH}$ for the HEMT.

FIG. 12 demonstrates that the HEMT exhibits significant hysteresis after stressing. The HEMT, when turning off the HEMT ($V_{GS}$ ramping from 6 V to −3 V) and at $V_{GS}$ at approximately 2.4 V, the I-V plots for the stressed HEMT (1, 2, 3, and 4 stresses in FIG. 12) starts to significantly differ from the I-V plots for the stressed HEMT (1, 2, 3, and 4 stresses in FIG. 12) when turning on the HEMT. When $I_{DS}$ is in a range from $1 \times 10^{-10}$ and $1 \times 10^4$, the turn-off slope is significantly less than the subthreshold slope. As seen in FIG. 12, the turn-off slope is in a range from 200 mV/dec to 250 mV/dec. The turn-off slope extends over approximately six decades of $I_{DS}$.

Figure 13:
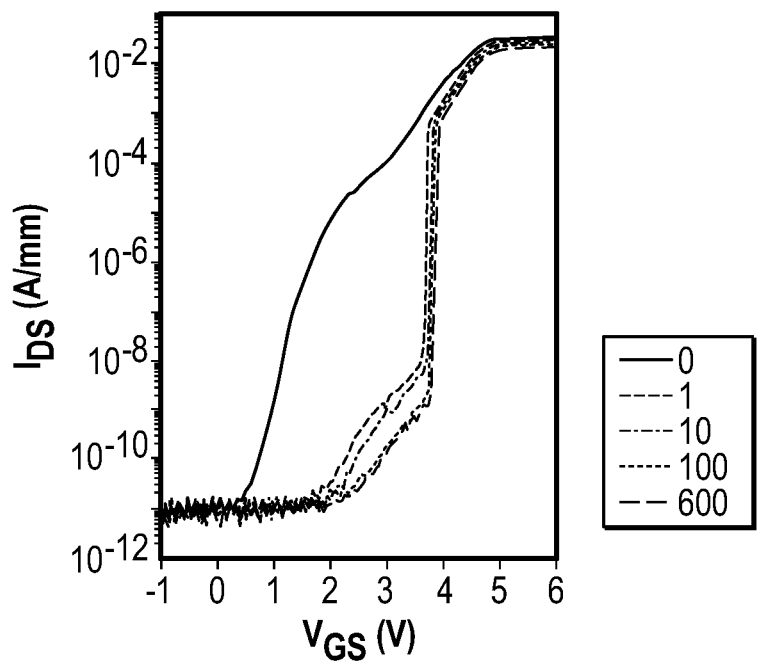
FIG. 13 includes an illustration of plots of drain-to-source current as a function of gate-to-source voltage for a HEMT as described herein.
Figure 14:
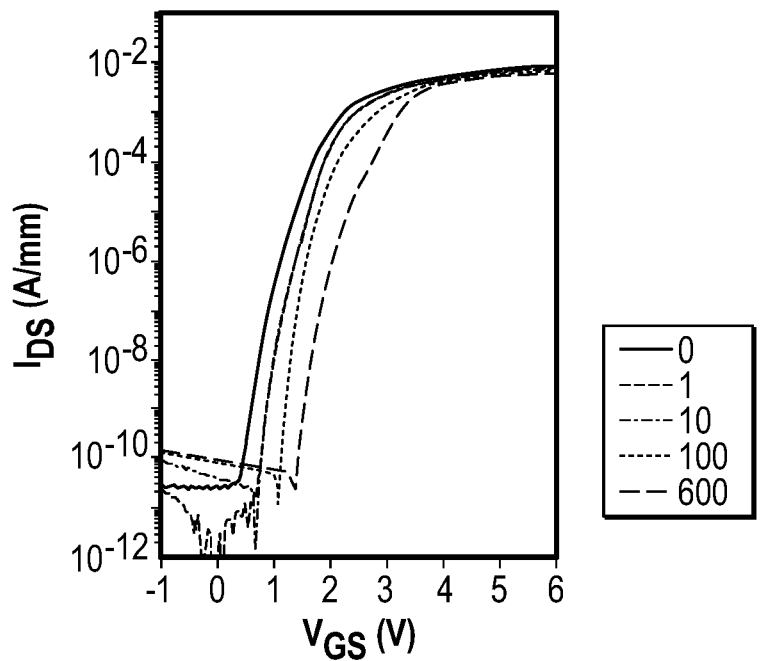
FIG. 14 includes an illustration of plots of drain-to-source current as a function of gate-to-source voltage for a conventional HEMT.

The improvements in $V_{TH}$ and subthreshold slope can be seen in FIGS. 13 and 14 when comparing a HEMT as described herein ("New HEMT) in FIG. 13 and a conventional HEMT in FIG. 14, wherein the conventional HEMT has a barrier layer that includes a single layer of $Al_{0.25}Ga_{0.75}N$ and has a thickness of 12.5 nm. Each HEMT was measured before stressing (corresponding to 0 in the legends of FIGS. 13 and 14) and after the number of occurrences of stressing (1, 10, 100, 600) using the stressing conditions as previously described with respect to FIG. 12. As can be seen in FIG. 13, the New HEMT has a substantially improved subthreshold slope after stressing the New HEMT. After one or more occurrences of stressing, the I-V plots show the New HEMT have a $V_{TH}$ in a range from 3.5 V to 4.0 V, and the subthreshold voltage slope of less than 20 mV/dec over six decades of $I_{DS}$. The conventional HEMT has a $V_{TH}$ of 1 V before stress and a subthreshold slope of 200 mV/dec over 6 decades of $I_{DS}$. The conventional HEMT suffers from off-state induced threshold voltage shift, while the sub-threshold slope increases with increasing stress time. Clearly, the New HEMT has a significantly higher $V_{TH}$ and a significantly steeper subthreshold slope as compared to the conventional HEMT.

Embodiments as described herein provide a HEMT with good $V_{TH}$ and subthreshold slope. The HEMT can be an enhancement-mode transistor that has a $V_{TH}$ of at least 2.0 V and a subthreshold slope of at most 50 mV/dec over at least three decades of $I_{DS}$. In some embodiments, the $V_{TH}$ can be in a range from 2.4 V to 4.0 V, and the subthreshold slope can be in a range from 5 mV/dec to 30 mV/dec over at least five decades of $I_{DS}$. Thus, the HEMTs as described herein have significantly higher threshold voltages and better control when turning on the transistors.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device including a high electron mobility transistor can include a channel layer, a first barrier layer including a first portion, a second portion, and a third portion; and a gate electrode of the high electron mobility transistor. The first barrier layer can be disposed between the channel layer and the gate electrode, the second portion of the first barrier layer can be spaced apart from the channel layer by the first portion of the first barrier layer, the second portion of the first barrier layer can be spaced apart from the gate electrode by the third portion of the first barrier layer, and the second portion of the first barrier layer can be configured to trap more charge, more readily recombine electrons and holes, or both as compared to each of the first and third portions of the first barrier layer.

Embodiment 2

The electronic device of Embodiment 1, wherein the second portion of the first barrier layer is configured to trap more charge and more readily recombine electrons and holes as compared to each of the first and third portions of the first barrier layer.

Embodiment 3

The electronic device of Embodiment 1, wherein the first barrier layer further includes a fourth portion and a fifth portion, the fourth portion of the first barrier layer is disposed between the third and fifth portions of the first barrier layer, the fourth portion of the first barrier layer is spaced apart from the gate electrode by the fifth portion of the first barrier layer, and the fourth portion of the first barrier layer is configured to trap more charge, more readily recombine electrons and holes, or both as compared to each of the third and fifth portions of the first barrier layer.

Embodiment 4

The electronic device of claim 1, wherein the second portion has a composition different from each of the first and third portions.

Embodiment 5

The electronic device of Embodiment 4, wherein the second portion of the first barrier layer includes a III-N material different from each of the first and third portions of the first barrier layer.

Embodiment 6

The electronic device of Embodiment 4, wherein the second portion of the first barrier layer includes $In_fAl_gGa_{(1-f-g)}N$, where $0<f\leq1.0$, $0\leq g<1.0$, and $(f+g)\leq1.0$.

Embodiment 7

The electronic device of Embodiment 6, wherein the first portion of the first barrier layer, the third portion of the first barrier layer, or both the first and third portions include $Al_zGa_{(1-z)}N$, where $0.1\leq z\leq0.5$.

Embodiment 8

The electronic device of Embodiment 4, wherein the second portion of the first barrier layer has a higher dopant concentration as compared to each of the first and third portions of the first barrier layer.

Embodiment 9

The electronic device of Embodiment 1, wherein the second portion has a higher crystal defect density as compared to each of the first and third portions of the first barrier layer.

Embodiment 10

The electronic device of Embodiment 1, wherein the second portion of the first barrier layer has a thickness in a range from 1 nm to 30 nm.

Embodiment 11

The electronic device of Embodiment 1, further includes a gate interconnect, wherein the gate interconnect forms a Schottky contact with the gate electrode.

Embodiment 12

The electronic device of Embodiment 11, wherein the gate electrode includes a p-type doped III-N material.

Embodiment 13

The electronic device of Embodiment 1, wherein the high mobility electron transistor further includes a source electrode (1) overlying at least a portion of a first thickness of the first portion of the first barrier layer or a second barrier layer or (2) extending through the first portion of the first barrier layer or a second barrier layer and contacting the channel layer; and a drain electrode (1) overlying at least a portion of a first thickness of the first portion of the first barrier layer or a second barrier layer or (2) extending through the first portion of the first barrier layer or a second barrier layer and contacting the channel layer.

Embodiment 14

The electronic device of Embodiment 13 further includes a gate interconnect, wherein the channel layer includes GaN, each of the first and third portions of the first barrier layer includes $Al_zGa_{(1-z)}N$, where $0.1 \leq z \leq 0.5$, the second portion of the first barrier layer includes $In_fAl_gGa_{(1-f-g)}N$, where $0 < f \leq 1.0$, $0 \leq g < 1.0$, and $(f+g) \leq 1.0$, the second portion of the first barrier layer is spaced apart from each of the channel layer and the gate electrode by at least 2 nm, the gate electrode includes p-type GaN, and the gate interconnect forms a Schottky contact with the gate electrode.

Embodiment 15

A method of using an electronic device can include coupling a drain electrode or a source electrode of a high electron mobility transistor to a first power supply, wherein the high electron mobility transistor further includes a gate electrode; a channel layer underlying the source, drain, and gate electrodes; and a barrier layer disposed between the channel layer and the gate electrode and including a first portion, a second portion, and a third portion, wherein the second portion is disposed between first and third portions, and the second portion has a higher In content, a higher dopant concentration, or a higher crystal defect density as compared to the first and third portions. The method can further include coupling the other of the drain electrode or the source electrode to an output node or a second power supply; and increasing $V_{GS}$ to turn on the transistor, wherein the transistor has a subthreshold slope of at most 50 mV/decade of $I_{DS}$ over three decades of $I_{DS}$.

Embodiment 16

The method of Embodiment 15, wherein the transistor has a subthreshold slope of at most 30 mV/decade of $I_{DS}$ over five decades of $I_{DS}$.

Embodiment 17

The method of Embodiment 16 further includes decreasing $V_{GS}$ to turn off the transistor, wherein the transistor has a turn-off slope of at least 50 mV/decade of $I_{DS}$ over three decades of $I_{DS}$.

Embodiment 18

The method of Embodiment 15, wherein the high electron mobility transistor has a threshold voltage of at least 2.0 V.

Embodiment 19

The method of Embodiment 15, wherein the high electron mobility transistor further includes a gate interconnect that forms a Schottky contact with the gate electrode.

Embodiment 20

A process of forming an electronic device including a high electron mobility transistor, the process can include forming a barrier layer over a channel layer, wherein the barrier layer includes a first portion, a second portion, and a third portion, and the second portion is disposed between the first and third portions; implanting ions into the barrier layer, such that after implanting is completed, the second portion has a higher dopant concentration or a higher crystal defect density as compared to each of the first and third portions; and forming a gate electrode of the high electron mobility transistor over the barrier layer. The second portion of the barrier layer can be spaced apart from the channel layer by the first portion of the barrier layer, and the second portion of the barrier layer can be spaced apart from the gate electrode by the third portion of the barrier layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a high electron mobility transistor comprising:
   a channel layer;
   a first barrier layer including a first portion, a second portion, and a third portion; and
   a gate electrode of the high electron mobility transistor, wherein:
      the first barrier layer is disposed between the channel layer and the gate electrode,
      the second portion of the first barrier layer is spaced apart from the channel layer by the first portion of the first barrier layer,
      the second portion of the first barrier layer is spaced apart from the gate electrode by the third portion of the first barrier layer,
      the second portion of the first barrier layer has a semiconductor base material different from a semiconductor base material of each of the first portion of the barrier layer and the third portion of the first barrier layer, and
      the second portion of the first barrier layer is configured to trap more charge, more readily recombine electrons and holes, or both as compared to each of the first and third portions of the first barrier layer.

2. The electronic device of claim 1, wherein the second portion of the first barrier layer is configured to trap more charge and more readily recombine electrons and holes as compared to each of the first and third portions of the first barrier layer.

3. The electronic device of claim 1, wherein the first barrier layer further comprises a fourth portion and a fifth portion, wherein:
   the fourth portion of the first barrier layer is disposed between the third and fifth portions of the first barrier layer,
   the fourth portion of the first barrier layer is spaced apart from the gate electrode by the fifth portion of the first barrier layer, and
   the fourth portion of the first barrier layer is configured to trap more charge, more readily recombine electrons and holes, or both as compared to each of the third and fifth portions of the first barrier layer.

4. The electronic device of claim 1, wherein the second portion of the first barrier layer comprises a III-N material different from each of the first and third portions of the first barrier layer.

5. The electronic device of claim 1, wherein the second portion of the first barrier layer comprises $In_fAl_gGa_{(1-f-g)}N$, where $0<f\leq1.0$, $0\leq g<1.0$, and $(f+g)\leq1.0$.

6. The electronic device of claim 5, wherein the first portion of the first barrier layer, the third portion of the first barrier layer, or both the first and third portions comprise $Al_zGa_{(1-z)}N$, where $0.1\leq z\leq0.5$.

7. The electronic device of claim 1, wherein the second portion has a higher crystal defect density as compared to each of the first and third portions of the first barrier layer.

8. The electronic device of claim 1, wherein the second portion of the first barrier layer has a thickness in a range from 1 nm to 30 nm.

9. The electronic device of claim 1, further comprising a gate interconnect, wherein the gate interconnect forms a Schottky contact with the gate electrode.

10. The electronic device of claim 9, wherein the gate electrode includes a p-type doped III-N material.

11. The electronic device of claim 1, wherein the high mobility electron transistor further comprises:
   a source electrode (1) overlying at least a portion of a first thickness of the first portion of the first barrier layer or a second barrier layer or (2) extending through the first portion of the first barrier layer or a second barrier layer and contacting the channel layer; and
   a drain electrode (1) overlying at least a portion of a first thickness of the first portion of the first barrier layer or a second barrier layer or (2) extending through the first portion of the first barrier layer or a second barrier layer and contacting the channel layer.

12. The electronic device of claim 11, further comprising a gate interconnect, wherein:
   the channel layer includes GaN,
   each of the first and third portions of the first barrier layer includes $Al_zGa_{(1-z)}N$, where $0.1\leq z\leq0.5$,
   the second portion of the first barrier layer includes $In_fAl_gGa_{(1-f-g)}N$, where $0<f\leq1.0$, $0\leq g<1.0$, and $(f+g)\leq1.0$,
   the second portion of the first barrier layer is spaced apart from each of the channel layer and the gate electrode by at least 2 nm,
   the gate electrode includes p-type GaN, and
   the gate interconnect forms a Schottky contact with the gate electrode.

13. A method of using an electronic device comprising:
   coupling a drain electrode or a source electrode of a high electron mobility transistor to a first power supply, wherein the high electron mobility transistor further comprises:
      a gate electrode;
      a channel layer underlying the source, drain, and gate electrodes; and
      a barrier layer disposed between the channel layer and the gate electrode and including a first portion, a second portion, and a third portion, wherein the second portion is disposed between first and third portions, and the second portion has a higher In content, a higher dopant concentration, or a higher crystal defect density as compared to the first and third portions;
   coupling the other of the drain electrode or the source electrode to an output node or a second power supply; and
   increasing $V_{GS}$ to turn on the transistor, wherein the transistor has a subthreshold slope of at most 50 mV/decade of $I_{DS}$ over three decades of $I_{DS}$.

14. The method of claim 13, wherein the transistor has a subthreshold slope of at most 30 mV/decade of $I_{DS}$ over five decades of $I_{DS}$.

15. The method of claim 14, further comprising decreasing $V_{GS}$ to turn off the transistor, wherein the transistor has a turn-off slope of at least 50 mV/decade of $I_{DS}$ over three decades of $I_{DS}$.

16. The method of claim 13, wherein the high electron mobility transistor has a threshold voltage of at least 2.0 V.

17. The method of claim 13, wherein the high electron mobility transistor further comprises a gate interconnect that forms a Schottky contact with the gate electrode.

18. A process of forming an electronic device comprising a high electron mobility transistor, the process comprising:
   forming a barrier layer over a channel layer, wherein the barrier layer includes a first portion, a second portion, and a third portion, and the second portion is disposed between the first and third portions;

implanting ions into the barrier layer, such that after implanting is completed, the second portion has a higher dopant concentration or a higher crystal defect density as compared to each of the first and third portions; and forming a gate electrode of the high electron mobility transistor over the barrier layer, wherein:
- the second portion of the barrier layer is spaced apart from the channel layer by the first portion of the barrier layer, and
- the second portion of the barrier layer is spaced apart from the gate electrode by the third portion of the barrier layer.

19. The process of claim 18, wherein in a finished electronic device, the second portion of the barrier layer has a higher crystal defect density as compared to each of the first portion of the barrier layer and the third portion of the barrier layer.

20. The process of claim 18, wherein implanting the ions into the barrier layer comprises implanting ions generated from a noble gas into the barrier layer.

* * * * *